(12) United States Patent
Kang et al.

(10) Patent No.: US 12,542,232 B2
(45) Date of Patent: Feb. 3, 2026

(54) MAGNETIC APPARATUS WITH SHEET-SHAPED PIN ASSEMBLIES, POWER MODULE, AND METHOD OF MAKING

(71) Applicant: MetaPWR Electronics Co., Ltd., Shanghai (CN)

(72) Inventors: Xiangfei Kang, Shanghai (CN); Yayu Li, Shanghai (CN)

(73) Assignee: MetaPWR Electronics Co., Ltd., Shanghai (CN)

( * ) Notice: Subject to any disclaimer, the term of this patent is extended or adjusted under 35 U.S.C. 154(b) by 120 days.

(21) Appl. No.: 18/409,713

(22) Filed: Jan. 10, 2024

(65) Prior Publication Data
US 2024/0249875 A1    Jul. 25, 2024

(30) Foreign Application Priority Data
Jan. 19, 2023 (CN) .......................... 202310086351.8

(51) Int. Cl.
| H01F 27/29 | (2006.01) |
| H01F 27/24 | (2006.01) |
| H01F 41/02 | (2006.01) |
| H05K 1/18  | (2006.01) |

(52) U.S. Cl.
CPC .......... *H01F 27/292* (2013.01); *H01F 27/24* (2013.01); *H01F 41/02* (2013.01); *H05K 1/18* (2013.01); *H05K 2201/10015* (2013.01); *H05K 2201/1003* (2013.01)

(58) Field of Classification Search
CPC ........ H01F 27/29; H01F 27/306; H01F 41/02; H01F 41/10; H05K 1/18
See application file for complete search history.

(56) References Cited

U.S. PATENT DOCUMENTS

| 2022/0285075 A1* | 9/2022 | Zhang | H01F 27/2823 |
| 2024/0250044 A1* | 7/2024 | Zeng | H01L 23/49811 |
| 2024/0282501 A1* | 8/2024 | Zhang | H01F 27/292 |
| 2024/0314933 A1* | 9/2024 | Zhang | H05K 1/118 |
| 2025/0210251 A1* | 6/2025 | Guo | H01F 17/04 |

* cited by examiner

*Primary Examiner* — Nathan Milakovich
(74) *Attorney, Agent, or Firm* — JCIPRNET

(57) ABSTRACT

A method includes disposing a substrate layer on a copper layer to form a pin assembly and adhering the pin assembly to a side surface of an inductor with bonding pads on either of the upper and lower surfaces, wherein welding surfaces are coplanarly aligned. An assembled magnetic apparatus including sheet-shaped pin assembly or pin assemblies and an inductor is thereby manufactured. A power module includes the magnetic apparatus, IPM units, a wiring board and output capacitors. The pin assembly may meet a PCB process specification for panel production, and the pin pitch is configured to be lessened.

29 Claims, 16 Drawing Sheets

MAGNETIC APPARATUS WITH SHEET-SHAPED PIN ASSEMBLIES, POWER MODULE, AND METHOD OF MAKING

CROSS-REFERENCE TO RELATED APPLICATION

This application claims the priority benefit of Chinese patent application serial no. 202310086351.8, filed on Jan. 19, 2023. The entirety of the above-mentioned patent application is hereby incorporated by reference herein and made a part of this specification.

BACKGROUND

Along with the fact that the data processing amount is greatly improved, more and more layers of a mainboard of the server are more and more precious, and the requirement for the occupied area of the power supply is higher and higher. Taking a large number of step-down circuits used by a server as an example, more and more schemes adopt a power module mode of stacking a power semiconductor element and a magnetic element to reduce the occupied area.

In addition, other schemes are selected to place the semiconductor on the inductor 15, so that a customer can install the radiator conveniently, and the overall power is improved. In this way, the transmission of the signal and the power in the stacking direction must pass through the inductor 15 to reach the switch device on the mainboard.

As shown in FIG. 1A, the power semiconductor element of the Buck circuit is composed of two switching devices, and a decoupling capacitor Cin1 needs to be placed nearby to suppress voltage spikes to ensure the reliability. Due to the limitation of the height and space of the module, the capacitance of Cin1 is usually relatively small, such as 1 μF, which is only used for reducing the equivalent loop inductance Lloop 1, so that more capacitor Cin2 needs to be placed at the position close to the module pin for filtering.

FIG. 1B shows a current power module, a power pin trace, and a signal pin trace (i.e., an outer wiring) and an inductor 19 at the same height. FIG. 1C shows the forming mode of the outer wiring. Firstly, the preformed metal frame is bonded with the body of inductor 19, and then the body of inductor 19 is bent on the upper surface and the lower surface of the inductor 19 to form effective welding surfaces respectively. By means of the arrangement, the occupied area of the power pin wiring is small, the utilization rate of space is very high.

Furthermore, the vertical conduction of the signal pin wiring in FIG. 1B is in a pin header mode. the pins are attached to the plastic part, and after being attached to the inductor 19 body, the pins are connected with the power semiconductor element for IPM welding. In order to ensure the stability of a plurality of signal pins, the signal pins need to be attached to the plastic body, the unilateral size L1 of the plastic body is at least 1 mm, and in order to ensure the welding reliability of the signal pins, the thickness L2 of the signal pins is at least 0.5 mm, so that the size of the whole signal pin header is 2.5 mm.

SUMMARY

In general, one aspect features a method comprises:
providing a copper layer;
disposing a substrate layer on the copper layer to form a pin assembly;
providing an inductor with bonding pads on either of an upper surface and a lower surface; and
adhering the pin assembly to a side surface of the inductor;
wherein the pin assembly is provided with at least one terminal surface; the terminal surface and the bonding pads are coplanar.

Implementations of the method may include one or more of following features. Further comprising semi-etching one surface of the copper layer to form one or more glue grooves.

Implementations of the method may include one or more of following features. Further comprising etching the copper layer to form a plurality of independent pins after disposing the substrate layer on the copper layer.

Implementations of the method may include one or more of following features. The substrate layer is formed from encapsulating materials with filling the glue grooves and disposed on the surface which is semi-etched.

Implementations of the method may include one or more of following features. Further comprising:
providing a second copper layer as the substrate layer;
semi-etching one surface of the substrate layer to form one or more glue grooves, wherein shapes of the glue grooves in the substrate layer are matched with shapes of the glue grooves in the copper layer; the glue grooves in the copper layer are arranged to be overlapped with the glue grooves in the substrate layer; and
disposing glue between the copper layer and the substrate layer, the glue filling the glue grooves.

Implementations of the method may include one or more of following features. An adhesive layer is disposed on the substrate layer; the copper layer is pressed onto the substrate layer, with the adhesive layer in contact with the surface which is semi-etched.

Implementations of the method may include one or more of following features. Further comprising:
milling slots on the substrate layer and the copper layer after disposing the substrate layer on the copper layer, wherein the terminal surface or terminal surfaces of the copper layer is formed at the edge of the slots; and
carrying out chemical gold plating.

Implementations of the method may include one or more of following features. The inductor comprises windings and a magnetically permeable core; the magnetically permeable core comprises two or more magnetically permeable core sections; the magnetically permeable core sections are assembled around the windings with one or more air gaps reserved between the magnetically permeable core sections.

Implementations of the method may include one or more of following features. The inductor comprises windings and a magnetically permeable core; the windings and the magnetically permeable core are integrally formed through a hot-pressing process.

In general, another aspect features apparatus, comprising:
at least one pin assembly and an inductor;
wherein the pin assembly comprises a substrate layer and at least one first pin adhered to the substrate layer;
wherein the inductor is provided with bonding pads on either of an upper surface or a lower surface; and
wherein the pin assembly is arranged on a side surface of the inductor; the pin assembly is in a sheet shape; the pin assembly is provided with at least one terminal surface which is coplanar with the bonding pads.

Implementations of the apparatus may include one or more of following features. The pin assembly is provided with two terminal surfaces; one of the terminal surfaces is coplanar with the bonding pads on the upper surface of the inductor and another of the terminal surfaces is coplanar with the bonding pads on the lower surface of the inductor.

Implementations of the apparatus may include one or more of following features. A second pin is configured as the substrate layer and bonded to the first pin through an insulating material; and
   wherein each of the first pin and the second pin is provided with a terminal arranged along a length direction on the terminal surface.

Implementations of the apparatus may include one or more of following features. The first pin is located between the substrate layer and the inductor.

Implementations of the apparatus may include one or more of following features. The inductor comprises one or more windings and two or more magnetically permeable core sections; and
   wherein the windings are arranged between the magnetically permeable core sections within grooves which are formed in the selected magnetically permeable core section or selected magnetically permeable core sections.

Implementations of the apparatus may include one or more of following features. The selected first pin or selected first pins comprise signal pins; air gaps are reserved between the magnetically permeable core sections, and the signal pins are arranged on the side surface off the air gaps.

Implementations of the apparatus may include one or more of following features. Limiting grooves are formed in the side surface of the inductor for matching the shape of the first pin or first pins; on the surface of adhering the pins to the inductor, the first pins protrude above the substrate layer.

Implementations of the apparatus may include one or more of following features. The pin assembly is provided with a thickness of 0.3-2.5 mm; and
   wherein the selected first pin or selected first pins comprise signal pins with a pin pitch of 0.20-1.27 mm.

Implementations of the apparatus may include one or more of following features. The selected first pin or selected first pins comprise at least one input voltage pin and at least one ground pin; the selected substrate layer or selected substrate layers are provided with a shielding layer or shielding layers; the shielding layer is arranged on a surface of the substrate layer opposite to the first pin.

Implementations of the apparatus may include one or more of following features. The ground pin and the shielding layer are electrically connected through vias in the substrate layer.

Implementations of the apparatus may include one or more of following features. At least two input voltage pins and at least two ground pins are provided, and the input voltage pins and the ground pins are alternately arranged.

Implementations of the apparatus may include one or more of following features. the winding comprises three vertical sections and two lateral sections which are alternately connected; the two lateral sections and one vertical section form a U-shaped part; and the other two vertical sections are additional lead-outs separately leading to the upper and the lower surfaces of the magnetically permeable core; and
   wherein the distance between the two lateral sections is twice the distance between an upper one of the lateral sections and the upper surface of the inductor, and the distance between the two lateral sections is twice the distance between a lower one of the lateral sections and the lower surface of the inductor.

Implementations of the apparatus may include one or more of following features. Two windings and three magnetically permeable core sections are provided; three magnetically permeable core sections comprise a first magnetically permeable core section, a second magnetically permeable core section, and a third magnetically permeable core section; the third magnetically permeable core section is arranged between the first and second magnetically permeable core sections; and
   wherein the windings are respectively arranged between the magnetically permeable core sections; either of the windings is arranged within a groove formed on a surface of the respective one of the first and second magnetically permeable core sections.

Implementations of the apparatus may include one or more of following features. The widths of the first magnetically permeable core section and the second magnetically permeable core section are the same, and the width of the third magnetically permeable core section is not more than two times of the width of the first magnetically permeable core section.

Implementations of the apparatus may include one or more of following features. The first and second magnetically permeable core sections are made of a material with high saturation magnetization, and the third magnetically permeable core section is made of a material with high magnetic permeability.

Implementations of the apparatus may include one or more of following features. Convexes are arranged on the lower surface of the inductor, and a lower edge of the pin assembly exceeds the lower surface of the inductor.

In general, another aspect features power module, comprising
   the apparatus according to the aforementioned;
   IPM units, a wiring board, and output capacitors;
   wherein the IPM units are arranged on the upper surface of the inductor;
   wherein the wiring board is arranged below the inductor;
   wherein the output capacitors are arranged on an upper surface of the wiring board or inside the wiring board; and
   wherein the wiring board and the IPM units are electrically connected through the pin assembly.

Implementations of the power module may include one or more of following features. The output capacitors are embedded in the wiring board; and
   wherein the wiring board is formed by providing at least two wiring layers and arranging at least one insulating layer with a high dielectric constant between the wiring layers.

Implementations of the power module may include one or more of following features. Further comprising a controller; wherein the controller is arranged on a surface of the magnetic apparatus, and the controller is electrically connected with the signal pins.

Implementations of the power module may include one or more of following features. Further comprising a plurality of input capacitors;
   wherein the first pin or first pins comprise input voltage pins and ground pins;
   wherein one end of each of the input capacitors is electrically connected with the selected input voltage pin or selected input voltage pins, and another end of each of the input capacitors is electrically connected with the selected ground pin or selected ground pins; and
   wherein at least one of the input capacitors is located on a lower surface of the IPM units.

DETAILED DESCRIPTION

Figure 1A:
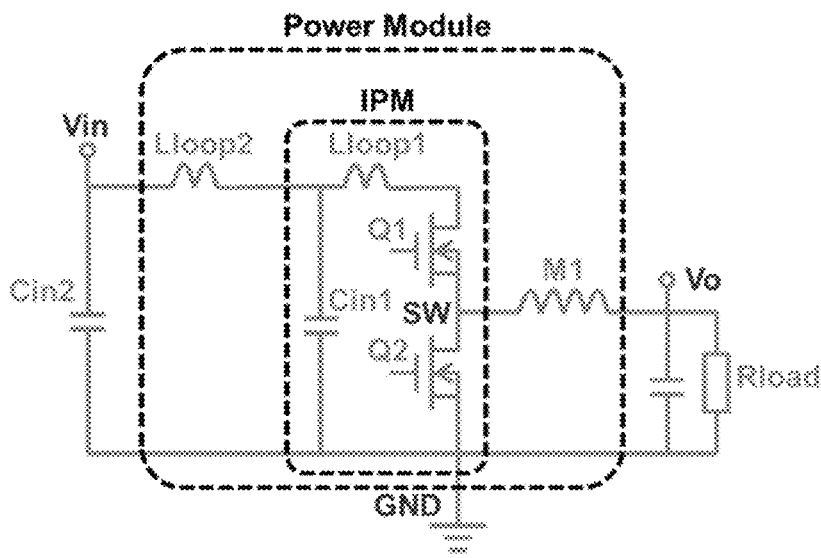
FIGS. 1A to 1D are schematic diagrams of a power module in the prior art.

The present application discloses various embodiments or examples of implementing the thematic technological schemes mentioned. To simplify the disclosure, specific instances of each element and arrangement are described below. However, these are merely examples and do not limit the scope of protection of this invention. For instance, a first feature recorded subsequently in the specification formed above or on top of a second feature may include an embodiment where the first and second features are formed through direct contact, or it may include an embodiment where additional features are formed between the first and second features, allowing the first and second features not to be directly connected. Additionally, these disclosures may repeat reference numerals and/or letters in different examples. This repetition is for brevity and clarity and does not imply a relationship between the discussed embodiments and/or structures. Furthermore, when a first element is described as being connected or combined with a second element, this includes embodiments where the first and second elements are directly connected or combined with each other, as well as embodiments where one or more intervening elements are introduced to indirectly connect or combine the first and second elements.

Figure 2A:
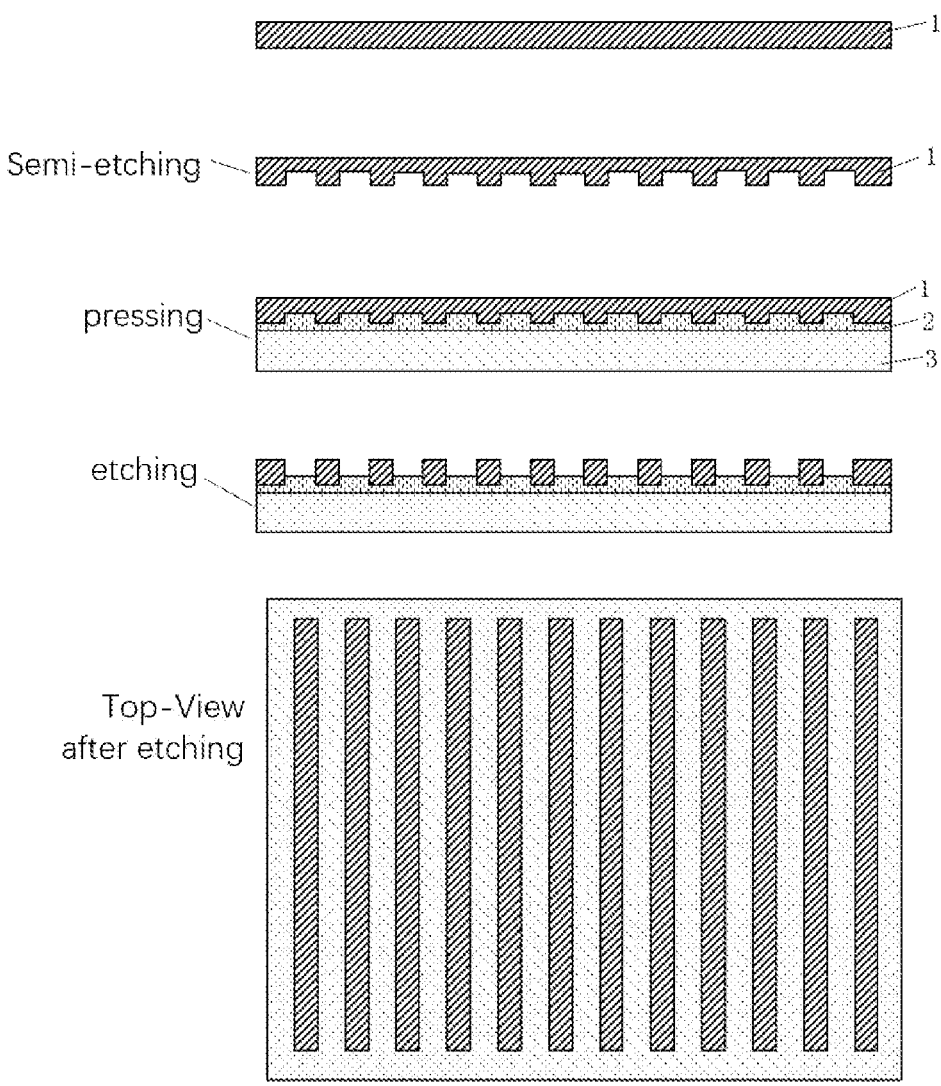
FIGS. 2A to 2D are diagrams of manufacturing magnetic apparatus according to one or more embodiments.
Figure 2B:
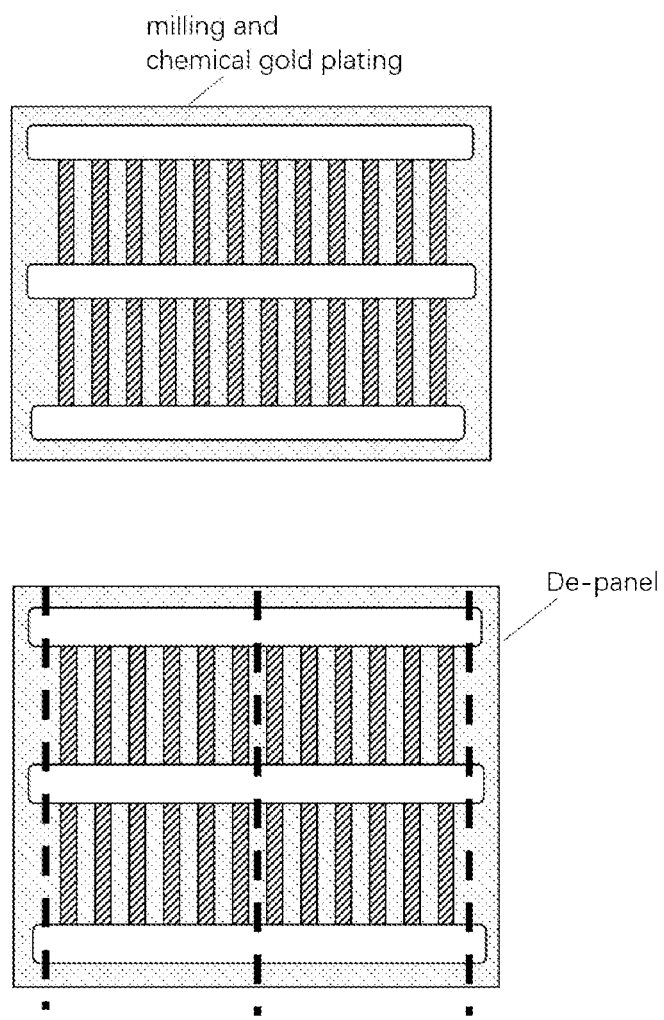

FIG. 2A shows a method for manufacturing a magnetic apparatus, and it can be understood by a person skilled in the art that the steps are as follows:

Step 1: manufacturing pin assemblies, which comprises the following steps:

Step 1-1: providing a copper layer 1, wherein the copper layer 1 may be configured to have a standard size in PCB process, such as 20 inches*24 inches, so that the method is carried out to a PCB process specification;

Step 1-1-1: carrying out semi-etching on the copper layer 1, forming a plurality of glue grooves on one surface of the copper layer 1, wherein the unetched surface region between the glue grooves is a pin region. This step is carried out for two reasons: firstly, compared with direct etching, a lessened pin pitch may be achieved through a pre-performed half-etching mode; secondly, during the following steps, more glue is reserved between the copper layer and the substrate layer 3 within the glue grooves, an improved binding force between the pins and the substrate layer 3 is thus provided, and the reliability is increased;

Step 1-2: pressing the semi-etched copper layer 1 onto a pre-glued substrate layer, wherein an adhesive glue layer 2 is disposed on a substrate layer 3 to form the pre-glued substrate layer, and the glue layer 2 is configured to be in contact with the surface which is semi-etched;

Step 1-2-1: further etching the copper layer 1 from the back side of the glue grooves; the pin region is thus divided to form independent pins;

In some embodiments, as shown in FIG. 2B, the substrate layer 3 and the copper layer 1 are both continuous sheets, and the method further comprise:

Step 1-3: milling slots on the pressed substrate layer 3 and semi-etched copper layer 1, wherein terminal surfaces of the independent pins are formed at the edge of the slots;

Step 1-4: carrying out chemical gold plating; gold plating layers are formed on metal surfaces including the upper surfaces of the pins, the side surfaces of the pins that are not covered by the glue layer 2, and the terminal surfaces that are formed at the slots.

Figure 3A:
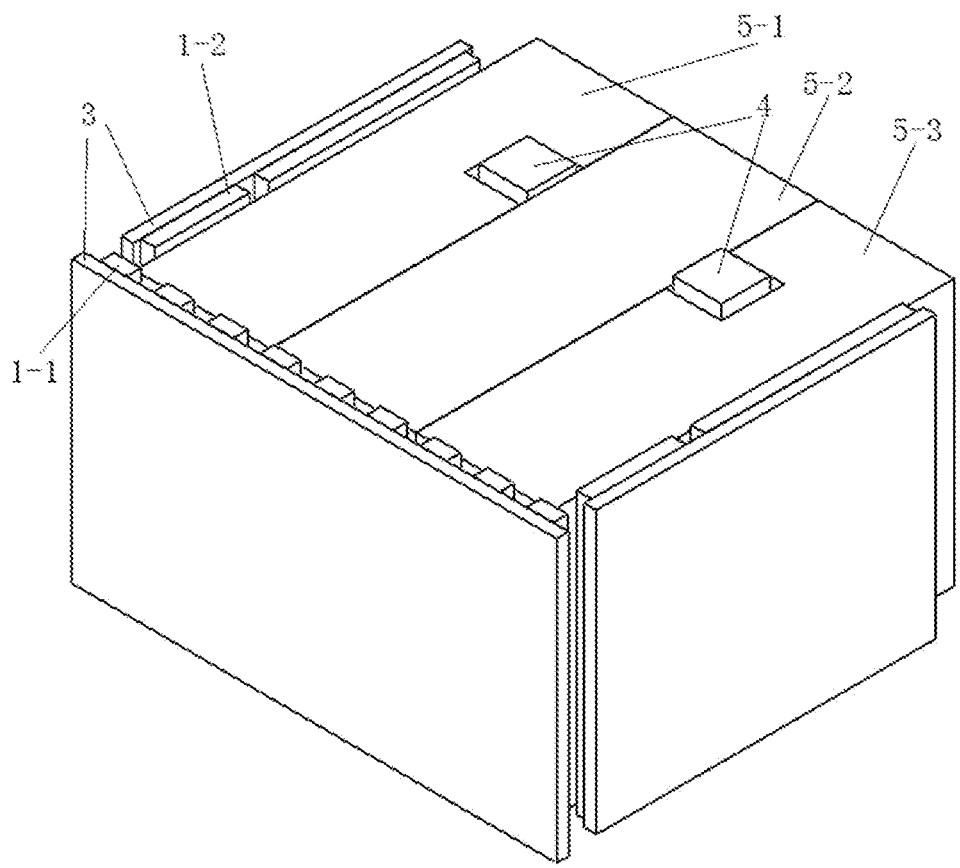
FIGS. 3A to 3F are structural diagrams of magnetic apparatus according to one or more embodiments.
Figure 3B:
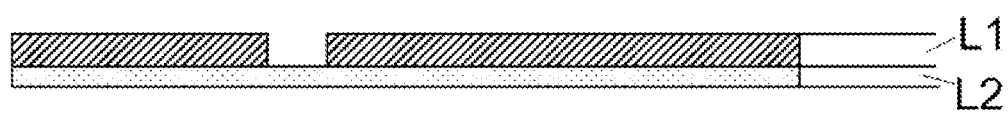
Figure 3B:
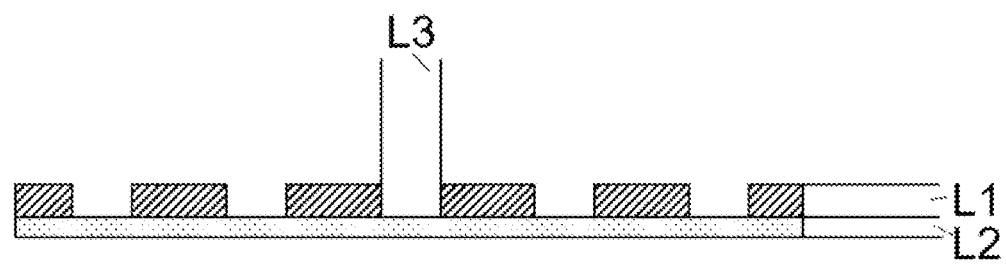

The aforementioned manufacturing steps of the pin assembly are carried out to a PCB process specification for the panel production; pin pitch L3 (as shown in FIG. 3B) may be set to be very small, such as 0.25 mm, so that more pins are placed within a limited predetermined size, and the wiring density is improved; and after the slots are milled, effective welding surfaces are simultaneously formed at the edges of the slots during the gold plating of the pins. The process is suitable for implementation, meeting a PCB process specification for panel production, and the cost is low. Due to the planar procession mode, the tolerance of the size of the divided boards (i.e., the pin assembly) is controlled within +/−0.1 mm, while in prior arts the tolerance is usually within +/−0.25 mm. Compared with prior arts, the pin assembly is manufactured with an improved size precision, the coplanarity of the input voltage pin 9, the ground pin 10, the signal pin 1-1 and the switch pins after the pin assembly or pin assemblies are integrated into the magnetic apparatus is improved, the welding quality is thus improved, and the long-term reliability of the power module (wherein the magnetic apparatus is used) is also obviously improved.

In some embodiments, the copper layer 1 may be directly bonded together with the substrate layer 3 through an adhesive glue layer 2 without semi-etching, and a plurality of independent pins are subsequently formed by means of an etching process. The embodiments of direct one-step etching may take less steps, while in the embodiments of two-step etching, etching depth of each etching step is halved by means of semi-etching in advance, so that the precision is improved.

In some embodiments, after step 1-3, an insulating layer may be pressed into the spacings formed by etching between the pins to reduce the warpage of the board. This process hardly affects the thickness of the board, thereby not changing the utilization rate of the magnetic core. The process of pressing can be realized by molding or PCB pressing process.

In addition, after the Step S1-2-1, the pin assembly may be placed into an oven for counterweight baking. Further, the substrate layer 3 and the copper layer 1 are pressed and semi-cured, and after the etching, the pin assembly is placed into the oven for counterweight baking. The semi-cured film is further cured during baking, and the baked pin assembly has a good flatness.

Due to the fact that the inductor, the pasting layers of the signal pin 1-1 and the power pin 1-2 form a whole in an assembling mode, in the assembling process, it can be ensured that one surface is flat, for example, the lower surface of the magnetic apparatus shown in FIG. 3A, when the magnetic element is assembled into a whole, the tolerance of each part must show a certain coplanarity problem on the upper surface, and therefore the height difference among the three parts can be made up in a tin planting mode. Compared with the prior art, the size precision of each component is obviously improved, so that the coplanarity of the pins is further improved in a tin planting mode, and the subsequent welding quality is improved.

Figure 2C:
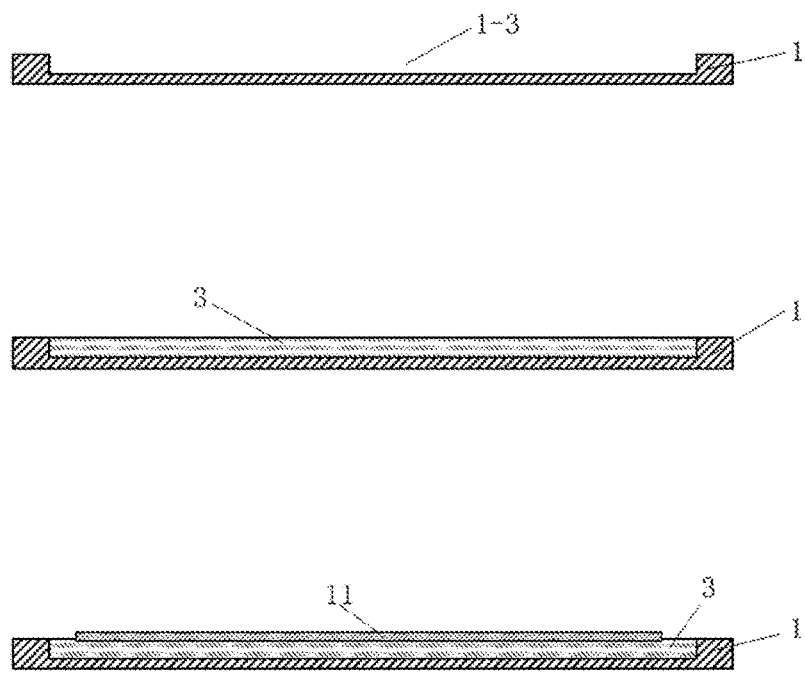

In some embodiments, as shown in FIG. 2C, a copper layer 1 is formed into a structure with a thin middle region and two thick edges through an etching process; then encapsulation material is disposed and a whole panel is formed by a plurality of copper layers 1 through a molding process; then a shielding layer 11 is formed on the back side of a substrate layer 3 (molding body) through a metallization process; finally, the panel is depanelled into independent units, and the dividing surface of the independent units becomes a welding surface for subsequent connection.

Figure 2D:
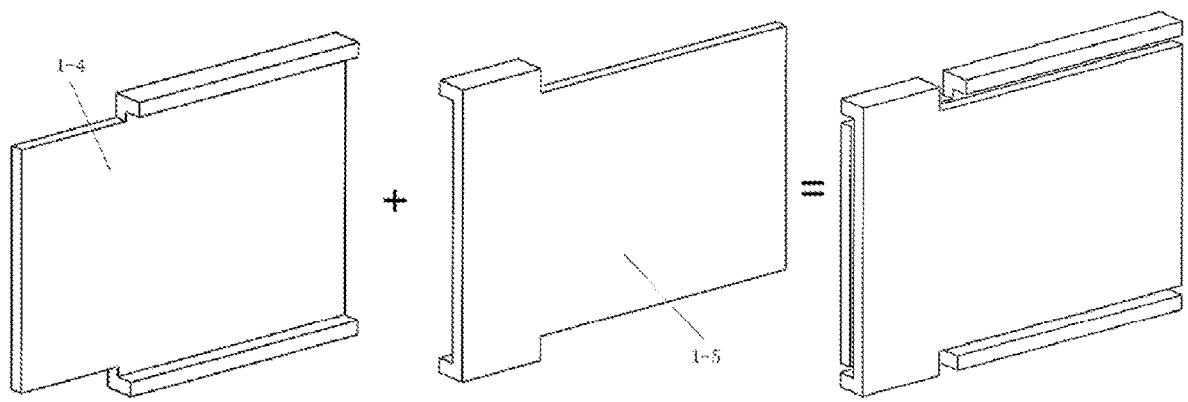

In some embodiments, as shown in FIG. 2D, the semi-etched copper layer is a first copper layer, corresponding to an input voltage pin 9 of the pin assembly, a second copper layer after the other half of the substrate layer 3 is etched, and corresponding to a ground pin 10 of the pin assembly, the two are bonded together through an insulating medium, the thickness of the insulating layer can be very thin, for example 50 μm, the area of the input current loop composed of the input voltage pin 9 and the ground pin 10 is obviously reduced, and the loop parasitic inductance can be effectively reduced.

The manufacturing method of the magnetic apparatus further comprises:

Step 2: providing windings 4 and a magnetically permeable core, wherein the magnetically permeable core comprises at least two magnetically permeable core sections, at least one magnetically permeable core section is provided with grooves within which the windings 4 are arranged, the magnetically permeable core sections are assembled around the windings 4, and air gaps are reserved between the magnetically permeable core sections.

Step 3: adhering the pin assembly or each of the pin assemblies to a surface of the magnetically permeable core, the pin assembly or each of the pin assemblies is disposed between the magnetically permeable core and the substrate layer.

In some embodiments, step 2 may also be: preparing windings 4 and a magnetically permeable core, and integrally forming the assembly of the windings and the magnetically permeable core by means of a hot-pressing process.

FIG. 3A shows a magnetic apparatus according to some embodiments, comprising: three pin assemblies, two windings and a magnetically permeable core;

The pin assembly comprises a substrate layer and a plurality of pins adhered to the substrate layer, wherein the pin assembly comprises a signal pin 1-1 pasting layer and two power pins 1-2 pasting layers;

The magnetically permeable core comprises a first magnetically permeable core section 5-1, a second magnetically permeable core section 5-2 and a third magnetically permeable core section 5-3. The first magnetically permeable core section 5-1 and the third magnetically permeable core section 5-3 are separated by the second magnetic core 5-2, gaps are respectively provided on one surface of the first magnetically permeable core section 5-1 and the third magnetically permeable core section 5-3 facing the second magnetically permeable core section 5-2, and the two windings 4 are respectively provided in gaps of the first magnetically permeable core section 5-1 and the third magnetically permeable core section 5-3;

The signal pins 1-1 are glued to one surface of the magnetically permeable core, the two power pins 1-2 are glued to the surfaces of the magnetically permeable cores on the two sides of the signal pin assembly respectively, and the pins are located between the substrate layer and the magnetically permeable core.

FIG. 3B shows the cross-sectional dimension of the pasting layer of the power pin 1-2 and the signal pin 1-1, wherein the power pin 1-2 pasting layer is shown in the upper diagram of the FIG. 3B, and the signal pin 1-1 pasting layer is shown in the lower diagram of the FIG. 3B. The thickness L2 of the substrate layer adhering the signal pin 1-1 pasting layer can be 0.1 mm, and the thickness L1 of the signal pin can also be smaller, such as 0.2 mm, so that the total thickness of the pin assembly can reach 0.3 mm, and compared with 2.5 mm of a signal pin header in the prior art, the signal pin 1-1 pasting layer has remarkable advantages. The distance between the signal pins can also be made smaller, such as 0.2 mm; similarly, the thickness L2 of the substrate layer adhering the power pin 1-2 can also be 0.1 mm, the thickness L1 can be set to different sizes according to the through flow requirement, and the limitation caused by the bending process in the prior art is avoided.

Figure 1B:
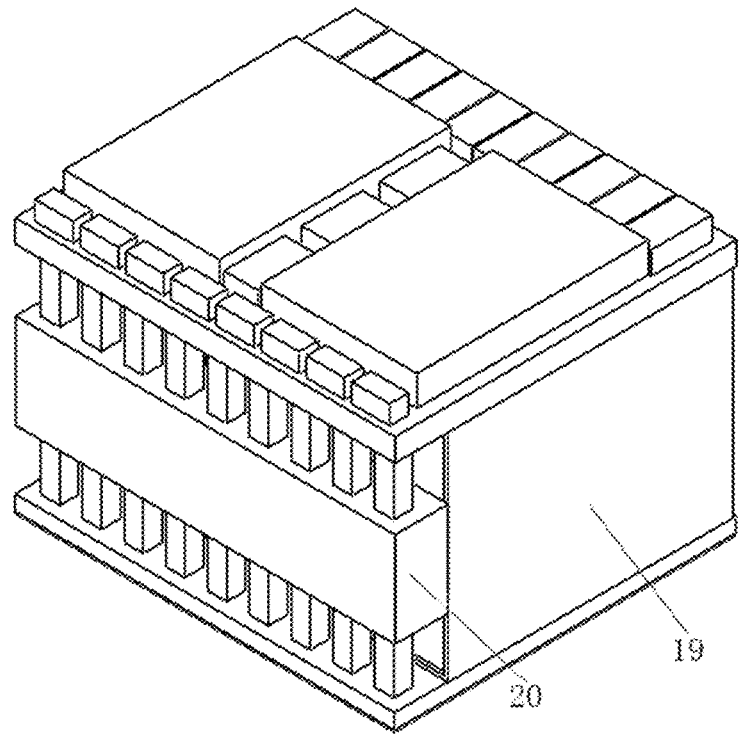
Figure 1C:
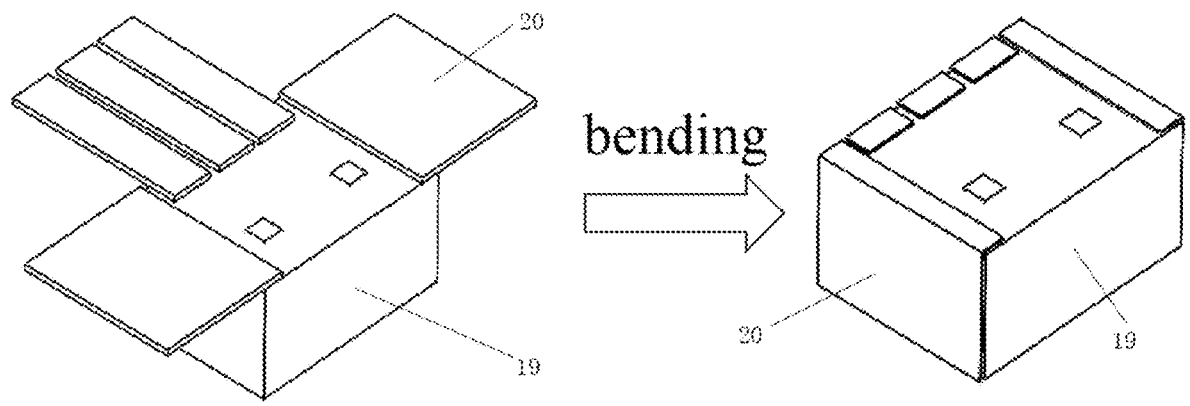
Figure 1D:
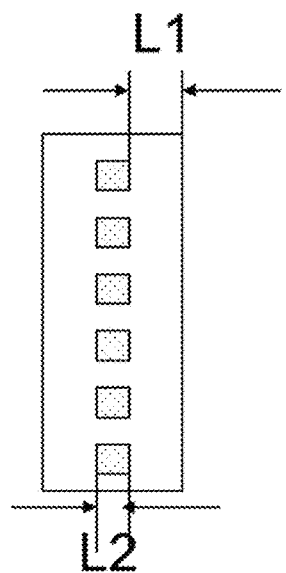

Compared with a pin header in FIG. 1B, the occupied area of the signal pin 1-1 pasting layer is greatly reduced, the size of the whole magnetic apparatus is obviously smaller than that in the prior art, and the magnetic loss can be obviously reduced.

Figure 3C:
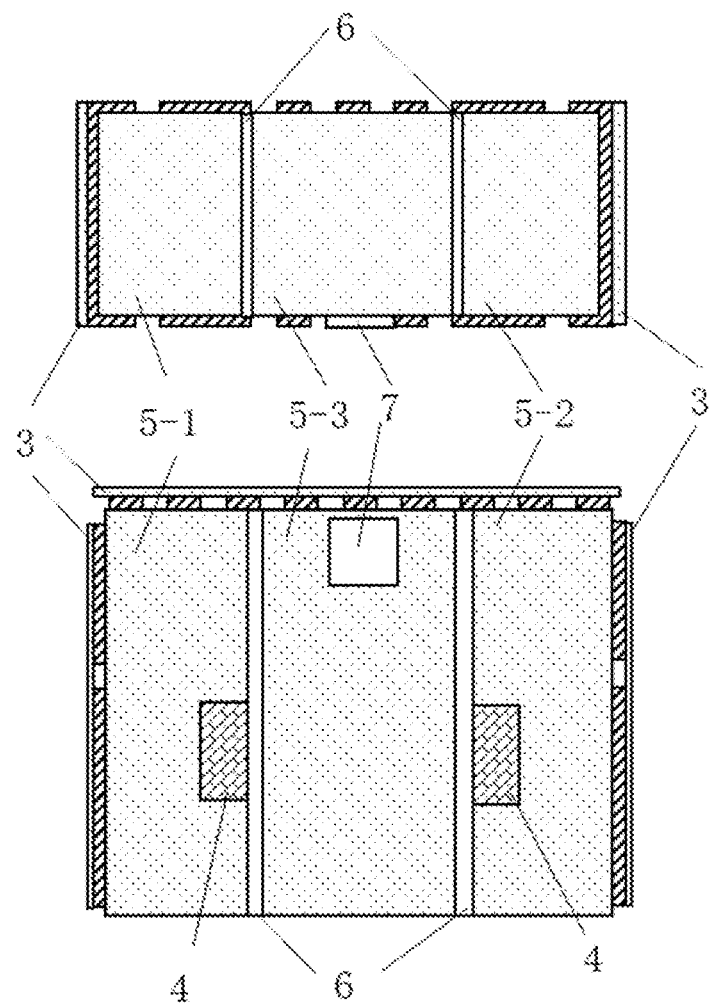

In some embodiments, the bottom of the magnetic apparatus is provided with a convex, and the lower edge of the pin pasting layer exceeds the bottom edge of the magnetic apparatus, as shown in FIG. 3C (the upper diagram of FIG. 3C is a side view, and the lower diagram of FIG. 3C is a bottom view), the convex 7 and the second magnetically permeable core section 5-2 are integrally formed, or are processed and formed after dispensing; the pins are higher than the core body; the height tolerance of the magnetically permeable core can be effectively absorbed; and the welding quality is improved.

Figure 3D:
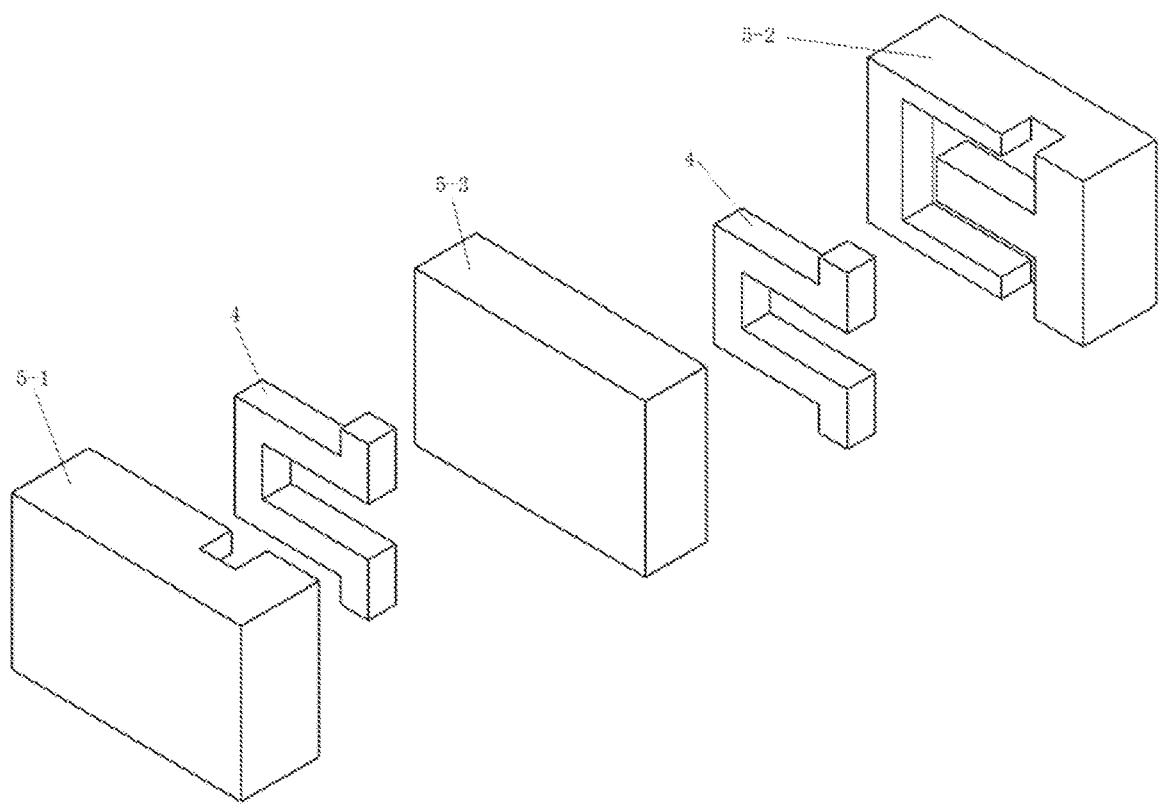

FIG. 3D shows an assembly mode of windings 4 and a magnetically permeable core. The windings 4 includes three vertical sections and two lateral sections which are alternately connected; the two lateral sections and one vertical section form a U-shaped part; and the other two vertical sections are additional lead-outs separately leading to the upper and the lower surfaces of the magnetically permeable core. Firstly, the first magnetically permeable core section 5-1 is assembled with one of the windings 4, the second magnetically permeable core section 5-2 is assembled with another of the windings 4, and then the assembled first magnetically permeable core section 5-1, the second magnetically permeable core section 5-2 and the third magnetically permeable core section 5-3 are assembled. According to the assembly process, the inductance can be adjusted by adjusting the air gap 6 between the first magnetically permeable core section 5-1 and the third magnetically permeable core section 5-3, the second magnetically permeable core section 5-2 and the third magnetic core 5-3 to obtain a desired inductance value, so that the implementation mode is very flexible.

Figure 3E:
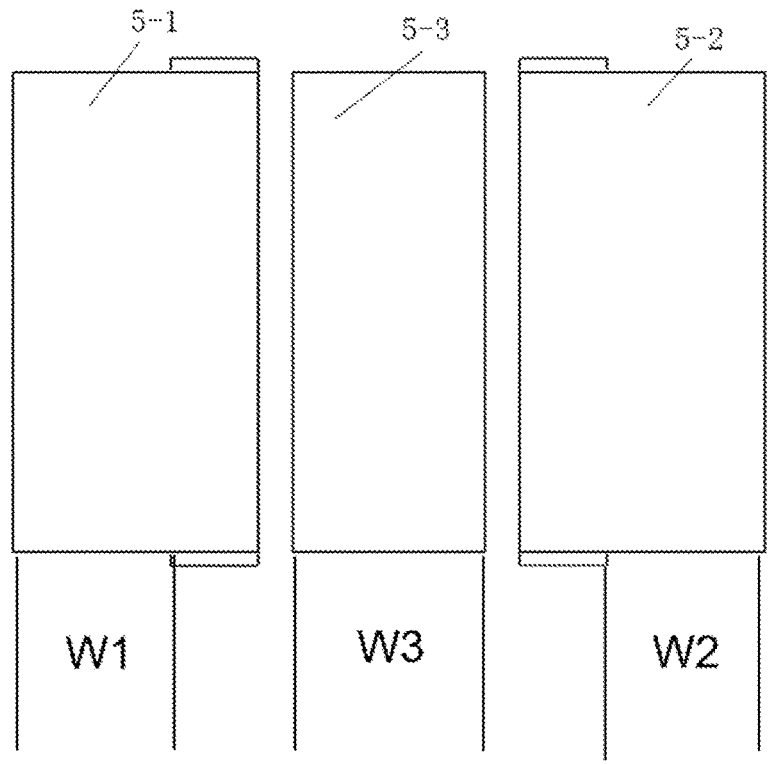

As shown in FIG. 3E, the width sizes of the first magnetically permeable core section 5-1, the second magnetically permeable core section 5-2 and the third magnetically permeable core section 5-3 are W1, W2 and W3 respectively.

In some embodiments, the first magnetically permeable core section 5-1 and the second magnetically permeable core section 5-2 have the same width, and the third magnetically permeable core section 5-3 has a width greater than a width of the first magnetically permeable core section 5-1 and a width no more than twice the first magnetically permeable core section 5-1, that is, W1<W3≤2W1, and the coupling coefficient of the two magnetic paths is relatively low, so as to apply for the application of two independent outputs.

In some embodiments, the widths of the first magnetically permeable core section 5-1 and the second magnetically permeable core section 5-2 are the same, and the width of the first magnetically permeable core section 5-1 and the second magnetically permeable core section 5-2 is greater than the width of the third magnetically permeable core section 5-3, that is, W1=W2>W3, and coupling coefficient of the two magnetic paths is relatively high, so as to apply for the application of two outputs in parallel. Extremely, W3 can be reduced to zero, the coupling coefficient will be the largest.

Figure 3F:
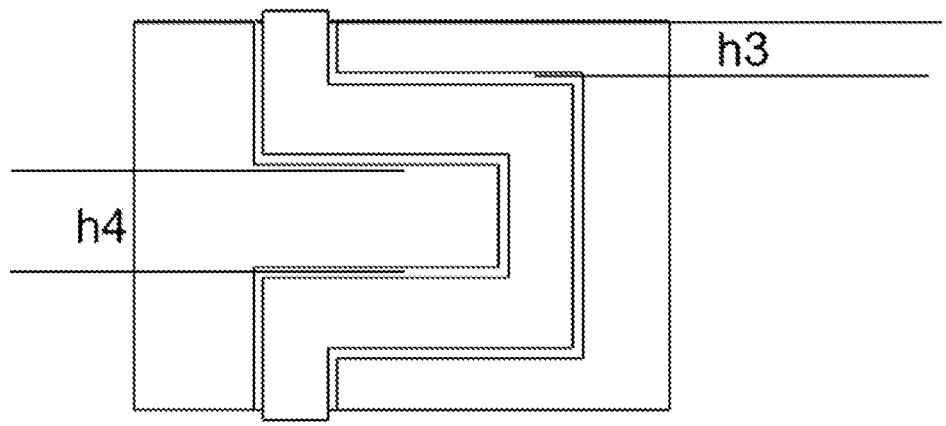

As shown in FIG. 3F, H4 is the distance between two lateral sections of the U-shaped part, H3 is the distance between the lateral section and the outer surface of the assembled magnetically permeable core section, and from the thickness direction, the volume of the magnetically permeable core section can be fully utilized by using this shaped winding, and H4 is approximately equal to two times of H3, so that the magnetic field distribution can be more uniform, and the magnetic loss is reduced.

In some embodiments, the first magnetically permeable core section 5-1 and the second magnetically permeable core section 5-2 are made of a material having a high saturation characteristic, and the third magnetically permeable core section 5-3 is made of a material having a high magnetic conductivity. For example, the third magnetically permeable core section 5-3 is made of ferrite, the first magnetically permeable core section 5-1 and the second magnetically permeable core section 5-2 are made of iron powder, the iron powder core has excellent saturation magnetization characteristics, and the ferrite core has relatively excellent magnetic permeability, so that under the condition of a certain size, the coupling coefficient can be very low for a non-coupling inductor. According to the assembly mode, different application scenes can be met, and optimal inductance characteristics are achieved through matching of different materials of the magnetic core.

In some embodiments, the inductor may also be formed by means of an integrated hot-pressing process, so that the complexity of the process can be further reduced. The thickness tolerance of the hot-pressed formed inductor is configured to be very small with a mechanical grinding, for example, +/−0.05 mm, and the welding quality of the pins is further improved.

Figure 4A:
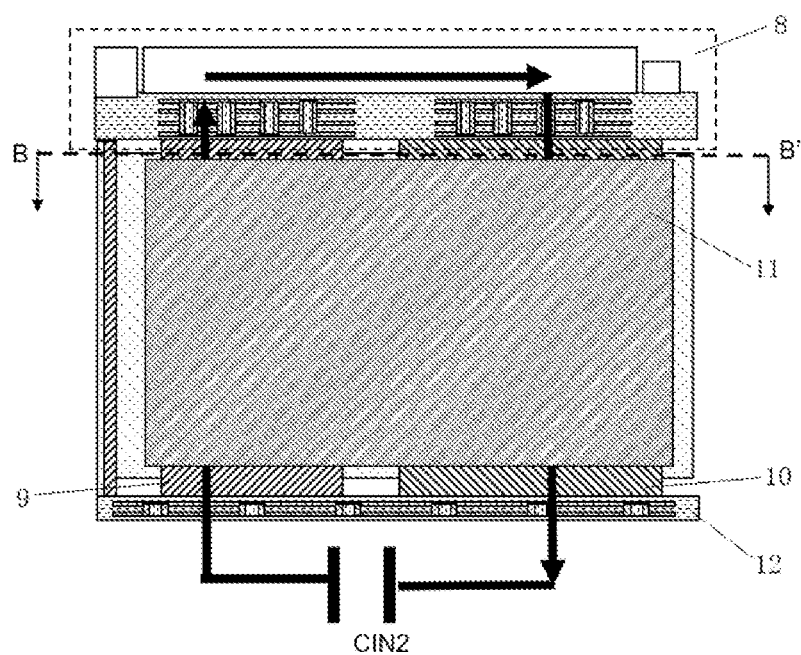
FIGS. 4A to 4D are structural diagrams of power modules according to one or more embodiments.

FIG. 4A shows a power module using the magnetic apparatus, further including: an input voltage pin 9 and a ground pin 10; the IPM units 8 are arranged on the upper surface of the inductor; and the wiring board 12 is arranged below the inductor; the wiring board 12 and the IPM unit are electrically connected with the two sides, corresponding to the two ends of the pin, or of the pin assembly; the shielding layer 11 and the input voltage pin 9 are arranged on the two faces of the substrate layer 3 respectively; and the shielding layer 11 at least covers the part, opposite to the input voltage pin 9, of the surface of the substrate layer 3.

Figure 4B:
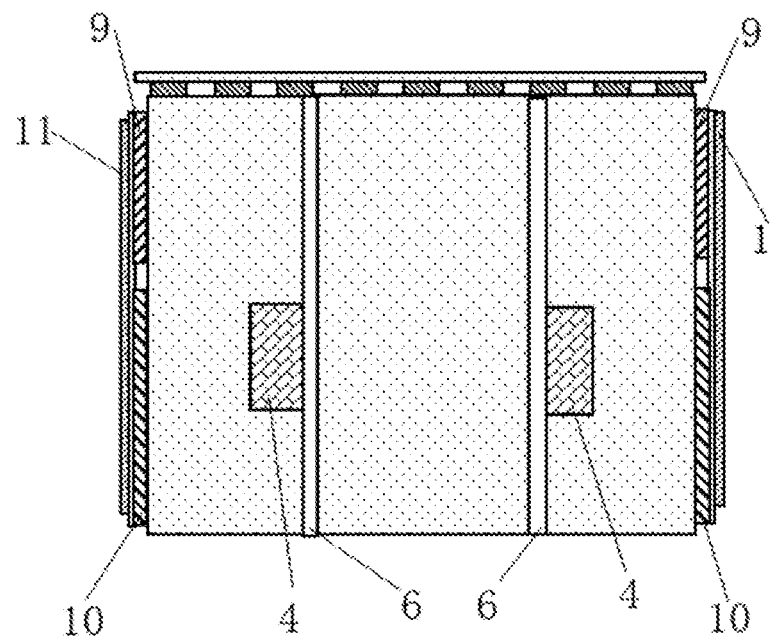

The pin assembly of the magnetically permeable core element can be electrically connected through the internal circuit of the wiring board 12 through the wiring board 12, and finally pin arrangement required by a client is formed at the bottom of the wiring board 12. In order to effectively reduce loop parasitic inductance, as shown in FIG. 4B, FIG. 4B is a cross-sectional top view of the B-B' in FIG. 4A, and a shielding layer 11 is added on the outer side of the loop formed by the input voltage pin 9 and the ground pin 10, so that the energy in parasitic inductance is dissipated, and the loop inductance is reduced.

Figure 4C:
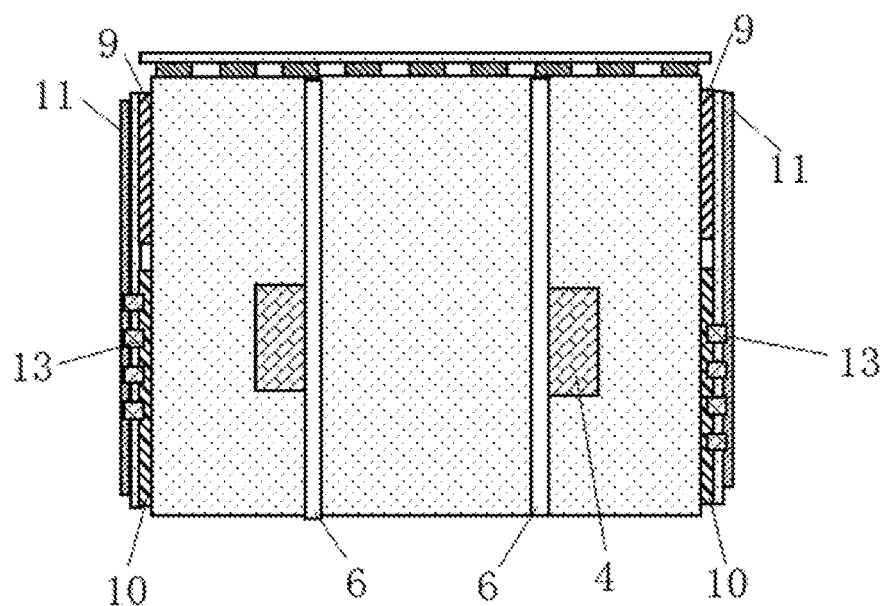

In some embodiments, as shown in FIG. 4C, the via 13 between the ground pin 10 and the shielding layer 11 is added, and the ground pin 10 and the shielding layer 11 are electrically connected through the via 13 penetrating through the substrate layer 3, so that the parasitic inductance of the loop can be further reduced.

Figure 4D:
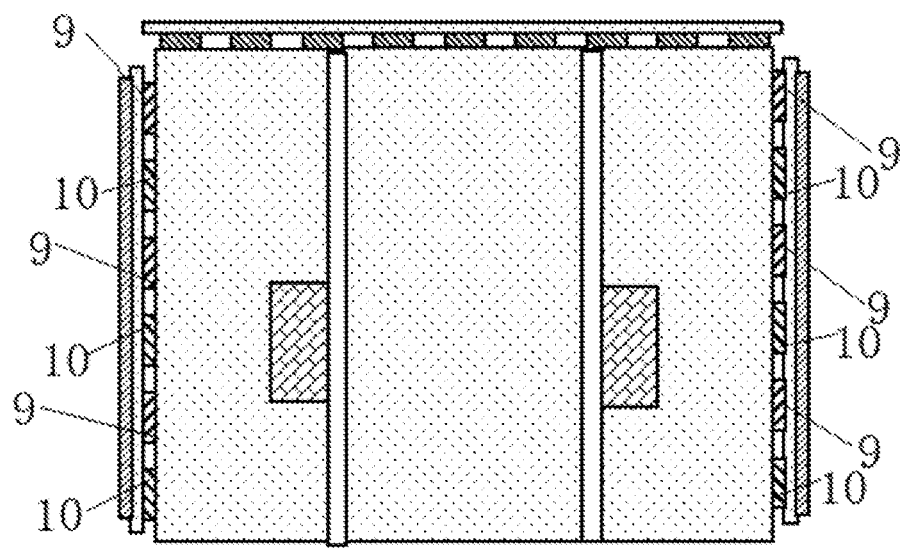

In some embodiments, as shown in FIG. 4D, the plurality of input voltage pins 9 and the ground pins 10 are alternately arranged, that is, the loops of the plurality of input voltage pins 9 and the ground pins 10 are connected in parallel, so that the parasitic inductance is reduced.

Figure 5A:
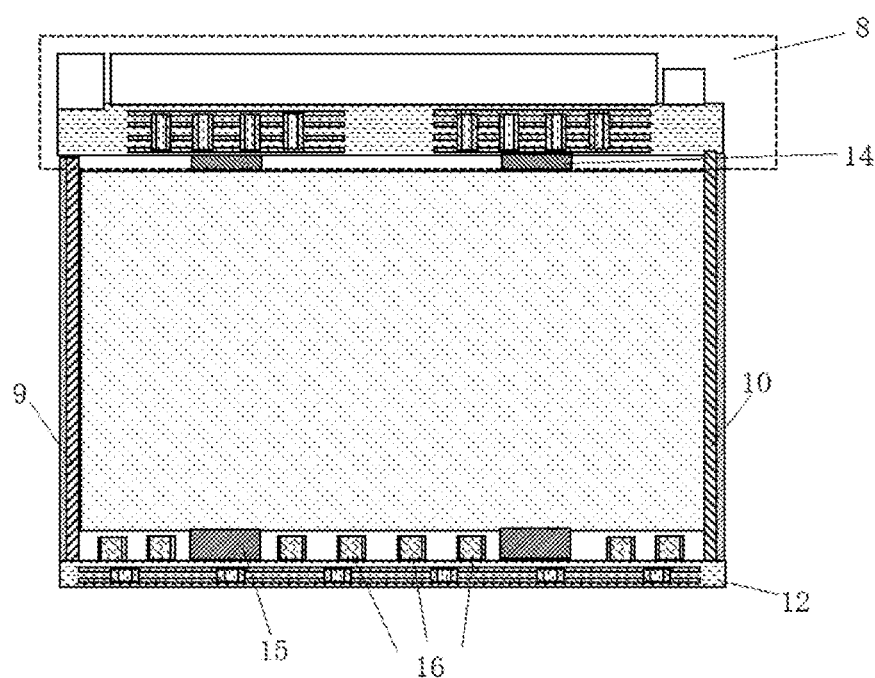
FIGS. 5A to 5C are diagrams of arrangement of the output capacitors according to one or more embodiments.

FIG. 5A shows another power module using the magnetically permeable core element, comprises an IPM unit 8 arranged on the upper surface of an inductor, a wiring board 12 arranged below the inductor, and an output capacitor 16 arranged on the upper surface of the wiring board 12, wherein the wiring board 12 and the IPM unit 8 are electrically connected with the two sides, corresponding to the two ends of the pin, of the pin assembly respectively. The protruding size of the welding surface on the lower surface of the inductive element can allow the output capacitors 16 to be placed, the output capacitor 16 is attached to the upper surface of the wiring board 12, and the inductive element is welded to the upper surface of the wiring board 12, so that the output capacitor 16 is located in the envelope range of the inductive element from all directions. The output capacitor 16 is integrated into the power module, so that the space of the system board can be saved, and the distance between the power module and the load can be shortened. The distance from the power module to the load is reduced, the transmission impedance between the power module and the load can be reduced, and the dynamic characteristic performance is better.

Figure 5B:
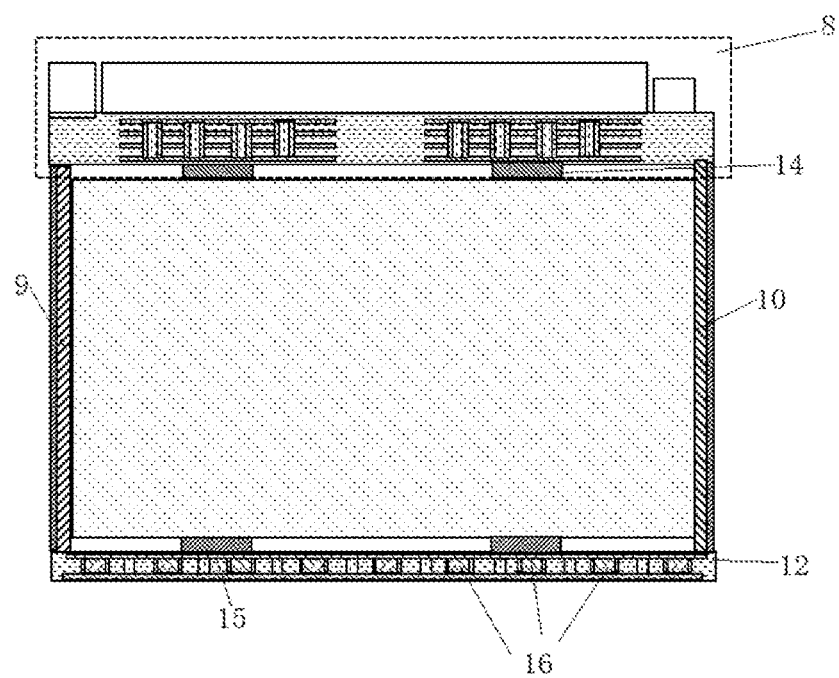

In some embodiments, as shown in FIG. 5B, the output capacitor 16 is embedded in the wiring board 12 to form a capacitor substrate, and the inductor element is electrically connected with the capacitor, so that the height of the power module can be further reduced.

Figure 5C:
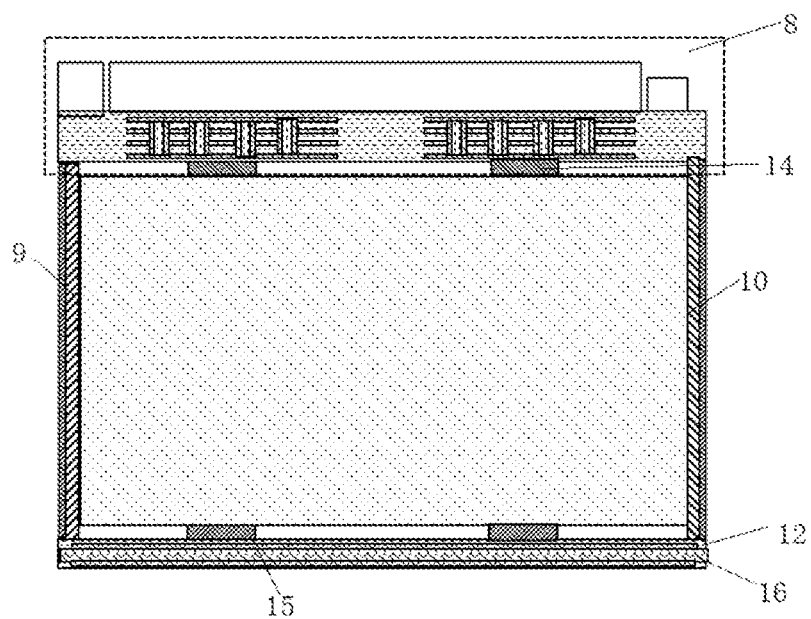

In some embodiments, as shown in FIG. 5C, the wiring board 12 comprises two wiring layers, and an insulating layer with a high dielectric constant is arranged between the wiring layers, so that the capacitance characteristic is formed, the space utilization is better, and the capacitance value can be effectively improved.

Figure 6A:
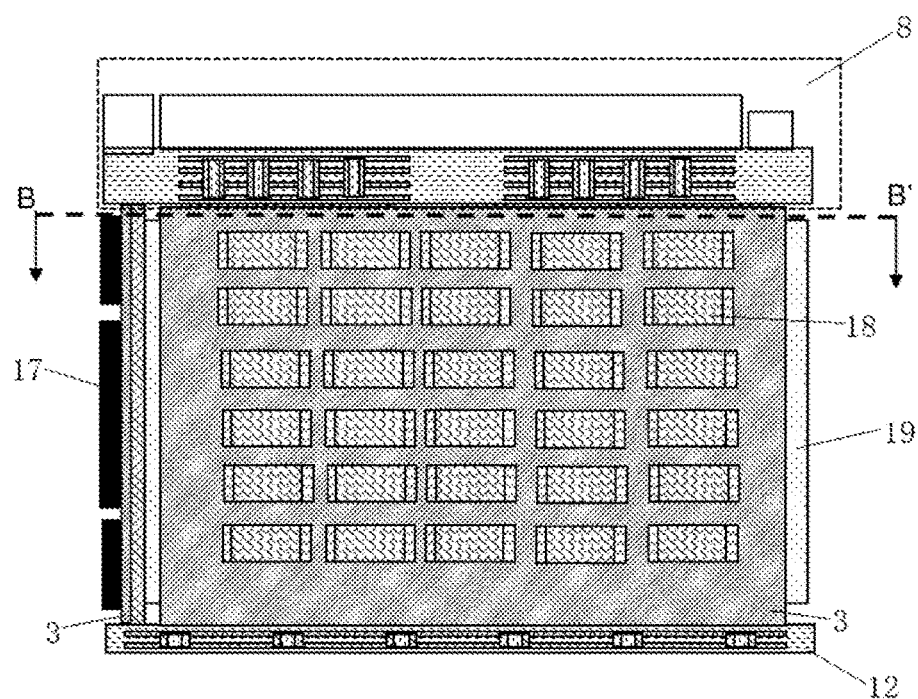
FIGS. 6A to 6D are diagrams of arrangement of the input capacitors according to one or more embodiments.
Figure 6B:
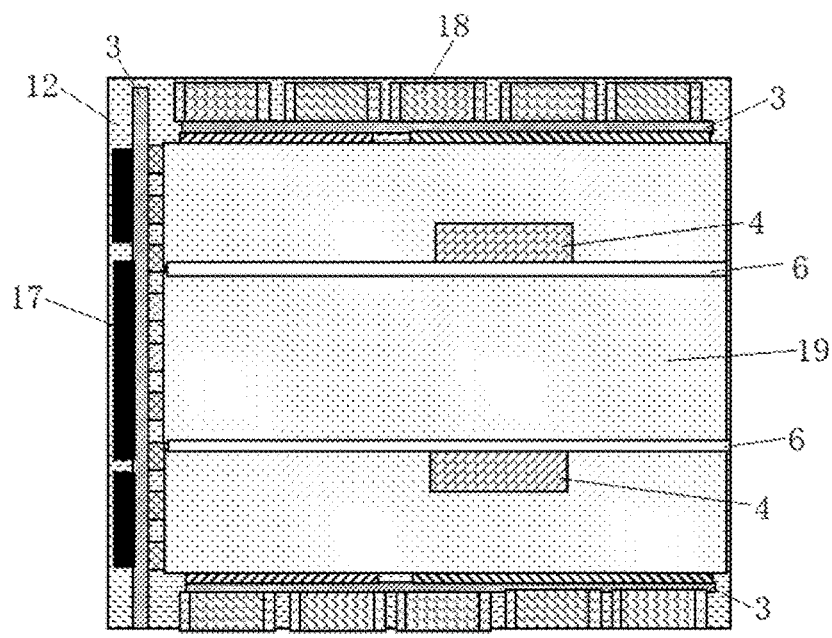

FIG. 6A shows another embodiment of power module using the magnetic apparatus. The power module further integrates a controller 17 and an input capacitor 18 (the input capacitor 18 in FIG. 6A is set on the side surface of the power module), the plurality of pins comprise at least one signal pin 1-1, at least one input voltage pin and at least one ground pin, the controller 17 is arranged on one surface of the pin assembly, the controller 17 is electrically connected with the signal pin 1-1 through a via 13 penetrating through the substrate layer 3, one end of the input capacitor 18 is electrically connected with the input voltage pin through a via 13 penetrating through the substrate layer 3, and the other end of the input capacitor 18 is electrically connected with the ground pin. FIG. 6B is a cross-sectional top view of the B-B' in FIG. 6A. The controller is electrically connected to a signal pin 1-1 on the other side by means of an internal wiring and a via hole (not shown). The input capacitor 18 is attached to one surface of an input voltage pin in the pin attachment layer, and is electrically connected to an input voltage pin of the other side by means of an internal wiring and a via hole (not shown). The controller is integrated at the position of the signal pin 1-1, so that the control loop can be shorter, the transmission loss is reduced, more input capacitors are integrated, the Loop 2 shown in FIG. 1A can be smaller, the parasitic inductance is smaller, and the loss is lower.

Figure 6C:
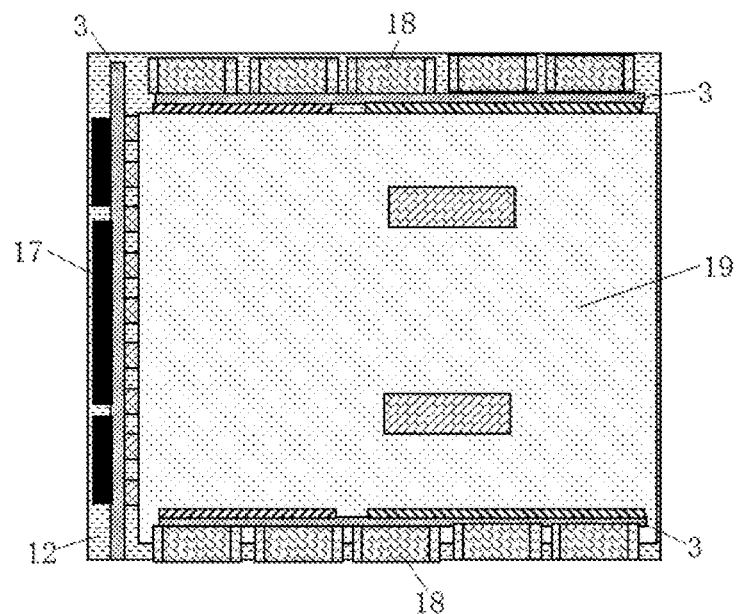

In some embodiments, as shown in FIG. 6C, the inductor is integrally formed from a magnetically permeable core and windings, e.g., formed by a hot-pressing process. The material of the magnetically permeable core is a combination of different materials. As mentioned above, for the non-coupled inductor, the part between the two windings can be ferrite core with relatively high magnetic conductivity, and the other parts of the magnetically permeable core are made of an iron powder material and are integrally formed through hot pressing.

Figure 6D:
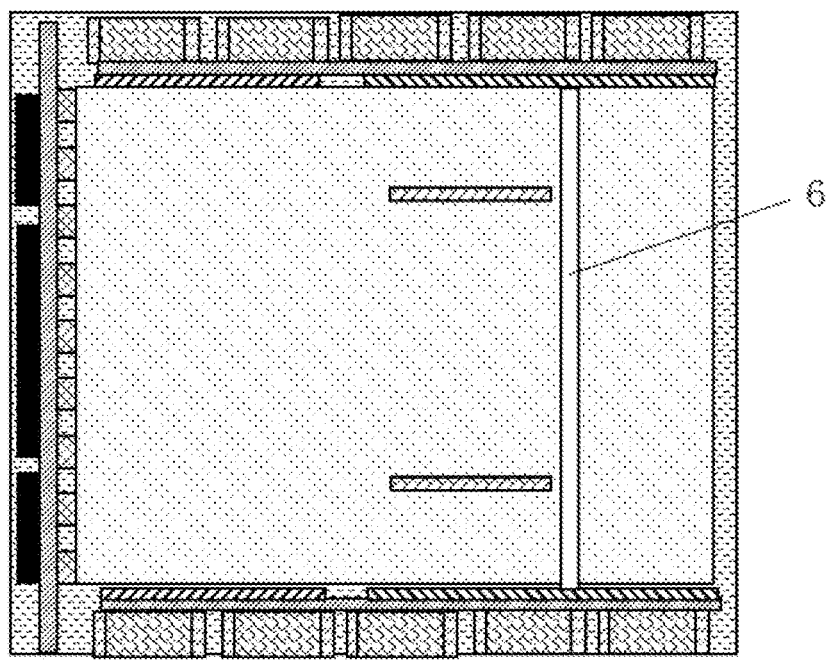

In some embodiments, as shown in FIG. 6D, when the magnetically permeable core section is assembled, an air gap 6 used for adjusting the inductance is reserved between the magnetically permeable core sections, if the air gap 6 is arranged at the position close to the signal pin 1-1, some signals are easily affected by an electromagnetic field, and signal transmission is unstable, so that the signal pin is arranged on other side surfaces of the inductor, and the problems can be solved.

Figure 7:
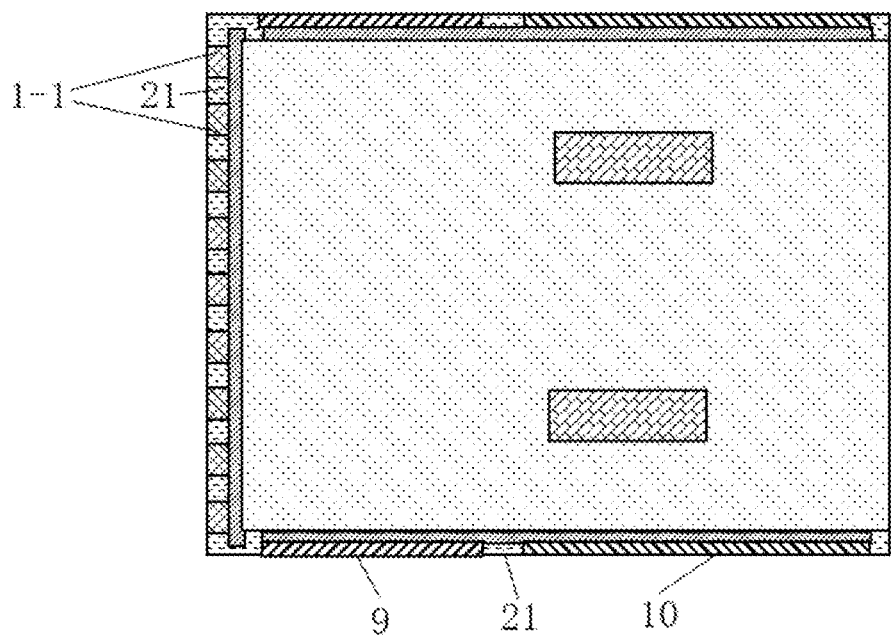
FIGS. 7 to 9 are structural diagrams of the power modules according to one or more embodiments.

In some embodiments, the pins of the pin assembly may also be disposed outwards, as shown in FIG. 7, for an improved precision of assembling in that some of the spacings between the pins, e.g. the spacing between the input voltage pin 9 and the ground pin 10 and the spacing between the signal pins 1-1, are configured as positioning grooves 21 for the positioning through the jig in the assembling process. A high-precision positioning is achieved through the jig, so that the precision of the relative position of the pins is high.

Figure 8:
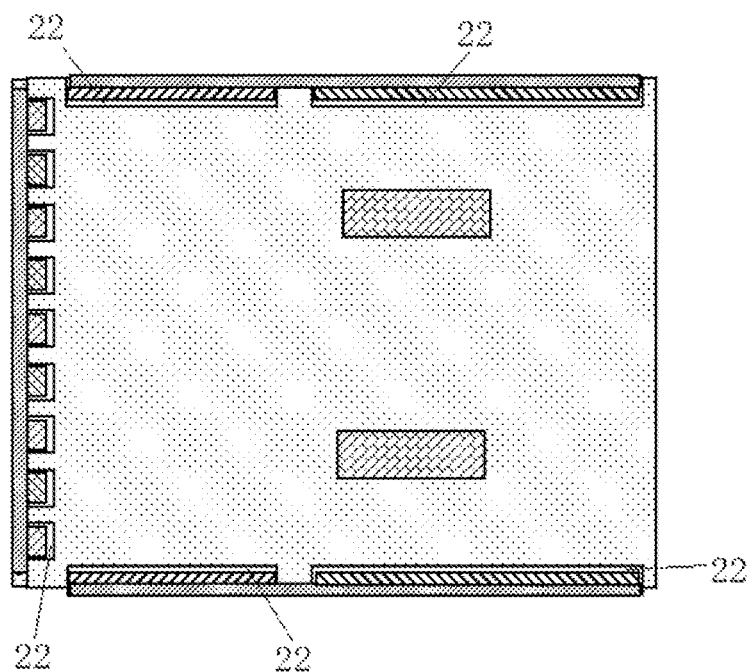

In some embodiments, as shown in FIG. 8, the magnetically permeable core is configured to provide a plurality of limiting grooves 22 on the surfaces, and the shape of the limiting grooves 22 is matched with the pin assembly, so that at the assembling of the pin assembly and the inductor, positioning is carried out through the limiting grooves 22 instead of an external positioning jig, and the manufacturing process is greatly simplified. Due to the fact that the limiting grooves 22 for the signal pins 1-1 and the power pins are integrally formed in the inductor, the precision of the relative position of the limiting grooves 22 is high, so that the precision of the relative position of the pins after assembling is accordingly high.

Figure 9:
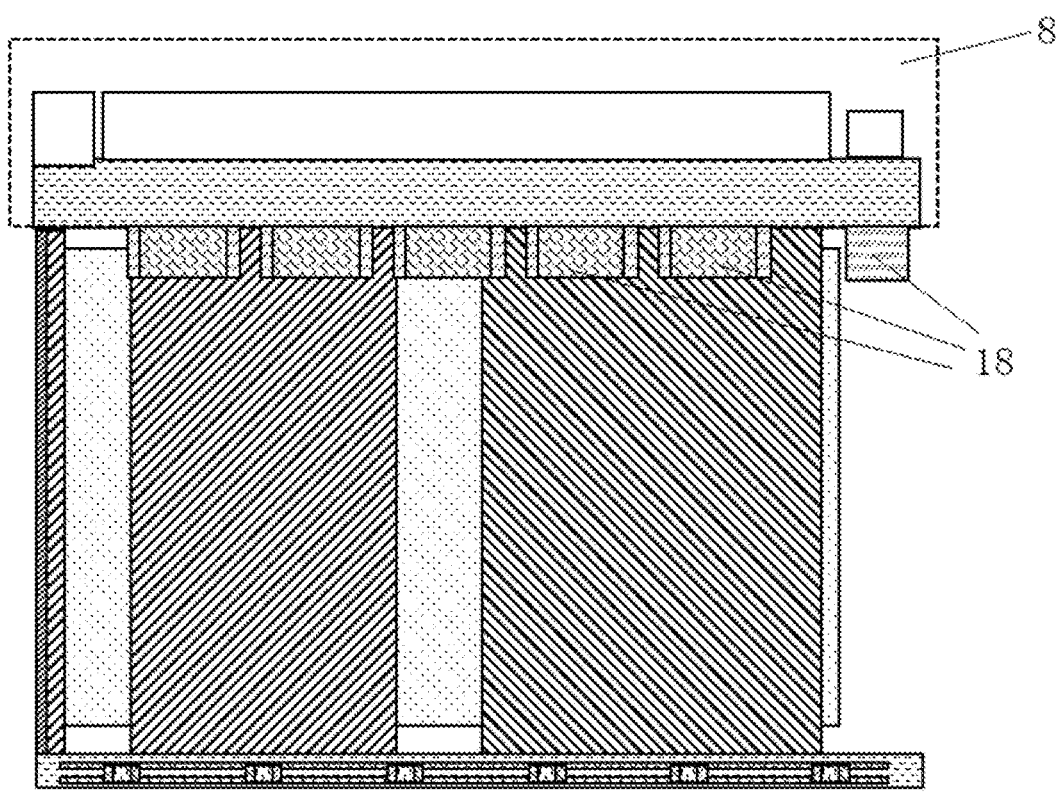

In some embodiments, as shown in FIG. 9, different from FIG. 6A, the input capacitor 18 is arranged around the magnetic core on the lower surface of the IPM unit 8, and the two ends of the input capacitor 18 are electrically connected with the input voltage pin 9 and the ground pin 10 through the electric connection structures (not shown in the Figure) in the IPM unit 8, so that the advantage is that the space is further saved.

What is claimed is:
1. A method, comprising:
providing a copper layer;
disposing a substrate layer on the copper layer to form a pin assembly;
providing an inductor with bonding pads on either of an upper surface and a lower surface; and
adhering the pin assembly to a side surface of the inductor;
wherein the pin assembly is provided with at least one terminal surface; the terminal surface and the bonding pads are coplanar.

2. The method of claim 1, further comprising semi-etching one surface of the copper layer to form one or more glue grooves.

3. The method of claim 2, further comprising etching the copper layer to form a plurality of independent pins after disposing the substrate layer on the copper layer.

4. The method of claim 2, wherein the substrate layer is formed from encapsulating materials with filling the glue grooves and disposed on the surface which is semi-etched.

5. The method of claim 2, further comprising:
providing a second copper layer as the substrate layer;
semi-etching one surface of the substrate layer to form one or more glue grooves, wherein shapes of the glue grooves in the substrate layer are matched with shapes of the glue grooves in the copper layer; the glue grooves in the copper layer are arranged to be overlapped with the glue grooves in the substrate layer; and
disposing glue between the copper layer and the substrate layer, the glue filling the glue grooves.

6. The method of claim 2, wherein an adhesive layer is disposed on the substrate layer; the copper layer is pressed onto the substrate layer, with the adhesive layer in contact with the surface which is semi-etched.

7. The method of claim 1, further comprising:
milling slots on the substrate layer and the copper layer after disposing the substrate layer on the copper layer, wherein the terminal surface or terminal surfaces of the copper layer is formed at an edge of the slots; and
carrying out chemical gold plating.

8. The method of claim 1, wherein the inductor comprises windings and a magnetically permeable core; the magnetically permeable core comprises two or more magnetically permeable core sections; the magnetically permeable core sections are assembled around the windings with one or more air gaps reserved between the magnetically permeable core sections.

9. The method of claim 1, wherein the inductor comprises windings and a magnetically permeable core; the windings and the magnetically permeable core are integrally formed through a hot-pressing process.

10. An apparatus, comprising:
at least one pin assembly and an inductor;
wherein the pin assembly comprises a substrate layer and at least one first pin adhered to the substrate layer;
wherein the inductor is provided with bonding pads on either of an upper surface or a lower surface; and
wherein the pin assembly is arranged on a side surface of the inductor; the pin assembly is in a sheet shape; the pin assembly is provided with at least one terminal surface which is coplanar with the bonding pads.

11. The apparatus of claim 10, the pin assembly is provided with two terminal surfaces; one of the terminal surfaces is coplanar with the bonding pads on the upper surface of the inductor and another of the terminal surfaces is coplanar with the bonding pads on the lower surface of the inductor.

12. The apparatus of claim 10, wherein a second pin is configured as the substrate layer and bonded to the first pin through an insulating material; and
    wherein each of the first pin and the second pin is provided with a terminal arranged along a length direction on the terminal surface.

13. The apparatus of claim 10, wherein the first pin is located between the substrate layer and the inductor.

14. The apparatus of claim 10, wherein the inductor comprises one or more windings and two or more magnetically permeable core sections; and
    wherein the windings are arranged between the magnetically permeable core sections within grooves which are formed in the selected magnetically permeable core section or selected magnetically permeable core sections.

15. The apparatus of claim 10, wherein the selected first pin or selected first pins comprise signal pins; air gaps are reserved between the magnetically permeable core sections, and the signal pins are arranged on the side surface off the air gaps.

16. The apparatus of claim 13, wherein limiting grooves are formed in the side surface of the inductor for matching a shape of the first pin or first pins; on the surface of adhering the pins to the inductor, the first pins protrude above the substrate layer.

17. The apparatus of claim 10, wherein the pin assembly is provided with a thickness of 0.3-2.5 mm; and
    wherein the selected first pin or selected first pins comprise signal pins with a pin pitch of 0.20-1.27 mm.

18. The apparatus of claim 10, wherein the selected first pin or selected first pins comprise at least one input voltage pin and at least one ground pin; the selected substrate layer or selected substrate layers are provided with a shielding layer or shielding layers; the shielding layer is arranged on a surface of the substrate layer opposite to the first pin.

19. The apparatus of claim 18, wherein the ground pin and the shielding layer are electrically connected through vias in the substrate layer.

20. The apparatus of claim 18, wherein at least two input voltage pins and at least two ground pins are provided, and the input voltage pins and the ground pins are alternately arranged.

21. The apparatus of claim 14, wherein the winding comprises three vertical sections and two lateral sections which are alternately connected; the two lateral sections and one vertical section form a U-shaped part; and the other two vertical sections are additional lead-outs separately leading to the upper and the lower surfaces of the magnetically permeable core; and
    wherein a distance between the two lateral sections is twice a distance between an upper one of the lateral sections and the upper surface of the inductor, and the distance between the two lateral sections is twice a distance between a lower one of the lateral sections and the lower surface of the inductor.

22. The apparatus of claim 14, wherein two windings and three magnetically permeable core sections are provided; the three magnetically permeable core sections comprise a first magnetically permeable core section, a second magnetically permeable core section, and a third magnetically permeable core section; the third magnetically permeable core section is arranged between the first and second magnetically permeable core sections; and
    wherein the windings are respectively arranged between the magnetically permeable core sections; either of the windings is arranged within a groove formed on a surface of the respective one of the first and second magnetically permeable core sections.

23. The apparatus of claim 22, wherein widths of the first magnetically permeable core section and the second magnetically permeable core section are the same, and a width of the third magnetically permeable core section is not more than two times of the width of the first magnetically permeable core section.

24. The apparatus of claim 22, wherein the first and second magnetically permeable core sections are made of a material with high saturation magnetization, and the third magnetically permeable core section is made of a material with high magnetic permeability.

25. The apparatus of claim 10, wherein convexes are arranged on the lower surface of the inductor, and a lower edge of the pin assembly exceeds the lower surface of the inductor.

26. A power module comprising:
    the apparatus according to claim 10;
    IPM units, a wiring board, and output capacitors;
    wherein the IPM units are arranged on the upper surface of the inductor;
    wherein the wiring board is arranged below the inductor;
    wherein the output capacitors are arranged on an upper surface of the wiring board or inside the wiring board; and
    wherein the wiring board and the IPM units are electrically connected through the pin assembly.

27. The power module of claim 26, wherein the output capacitors are embedded in the wiring board; and
    wherein the wiring board is formed by providing at least two wiring layers and arranging at least one insulating layer with a high dielectric constant between the wiring layers.

28. The power module of claim 26, further comprising a controller; wherein the controller is arranged on a surface of the apparatus, and the controller is electrically connected with signal pins.

29. The power module of claim 26, further comprising a plurality of input capacitors;
    wherein the at least one first pin comprises input voltage pins and ground pins;
    wherein one end of each of the input capacitors is electrically connected with the selected input voltage pin or selected input voltage pins, and another end of each of the input capacitors is electrically connected with the selected ground pin or selected ground pins; and
    wherein at least one of the input capacitors is located on a lower surface of the IPM units.

* * * * *